(12) United States Patent
Shimizu

(10) Patent No.: US 6,906,926 B2
(45) Date of Patent: Jun. 14, 2005

(54) ELECTRONIC EQUIPMENT

(75) Inventor: Noriyuki Shimizu, Kawagoe (JP)

(73) Assignee: Pioneer Corporation, Tokyo-to (JP)

( * ) Notice: Subject to any disclaimer, the term of this patent is extended or adjusted under 35 U.S.C. 154(b) by 182 days.

(21) Appl. No.: 10/379,685

(22) Filed: Mar. 6, 2003

(65) Prior Publication Data

US 2003/0156387 A1 Aug. 21, 2003

Related U.S. Application Data

(63) Continuation of application No. 09/985,036, filed on Nov. 1, 2001, now abandoned.

(30) Foreign Application Priority Data

Nov. 2, 2000 (JP) ........................................ 2000-335308

(51) Int. Cl.[7] ................................................ H05K 5/03
(52) U.S. Cl. ......................... 361/726; 361/679; 361/724
(58) Field of Search ................................. 361/679–680, 361/683, 685–686, 724–727; 312/223.1–223.3

(56) References Cited

U.S. PATENT DOCUMENTS

| 4,134,070 A | | 1/1979 | Henderson et al. |
| 4,704,604 A | * | 11/1987 | Fuhs ........................... 361/680 |
| 4,832,419 A | | 5/1989 | Mitchell et al. |
| 5,185,804 A | * | 2/1993 | Watanabe ..................... 381/86 |
| 5,430,607 A | | 7/1995 | Smith |
| 5,493,479 A | * | 2/1996 | Takahashi .................... 361/814 |
| 5,953,302 A | * | 9/1999 | Kobayashi ................. 369/75.1 |

FOREIGN PATENT DOCUMENTS

| EP | 0 507 987 A1 | 10/1992 |
| EP | 0 658 011 A1 | 6/1995 |

* cited by examiner

Primary Examiner—Yean-Hsi Chang
(74) Attorney, Agent, or Firm—Young & Thompson

(57) ABSTRACT

An electronic equipment (S1) is provided with: a holding portion (2) having a longitudinal plate shape, which is disposed on a front surface of an apparatus main body of the electronic equipment and is movable between a first position to cover the front surface and a second position to expose the front surface to an open air; an operation panel (1) having a longitudinal shape; and a holding mechanism (3, 6) for holding the operation panel detachably with respect to the holding portion. The holding mechanism has a locking device (3) disposed on the holding portion and an engaging device (6) disposed on a back surface of the operation panel. The locking device includes a pair of lock portions disposed on the holding portion at both sides portions in a longitudinal direction of the holding portion. The engaging device includes a pair of engagement portions disposed on the operational panel at both side portions in a longitudinal direction of the operation panel.

20 Claims, 7 Drawing Sheets

ELECTRONIC EQUIPMENT

This application is a continuation of application Ser. No. 09/985,036, filed on Nov. 1, 2001, now abandoned the entire contents of which are hereby incorporated by reference.

BACKGROUND OF THE INVENTION

1. Field of the Invention

The present invention relates to an electronic equipment, in which an operation panel is detachable with respect to an apparatus main body.

2. Description of the Related Art

As an electronic equipment, in which an operation panel is detachable with respect to an apparatus main body, there is an on-vehicle AV (Audio/Visual) apparatus, in which an operation panel is detachable with respect to a holding or retaining member freely movable between a close position to cover a front surface of the apparatus main body and an open position to expose or open the front surface of the apparatus main body to the open air.

For example, according to one holding mechanism, the operation panel is attached to and held by a slide board, which is shaped in a longitudinal flat plate and holds the operation panel, at the front surface side of the apparatus main body.

The slide board is moved by a driving mechanism from the close position or condition that the operation panel is normally set to the apparatus main body, to the open position or condition that the front surface of the apparatus main body as well as a record medium insertion slot disposed thereon is exposed to the open air, so that it possible to insert or remove therethrough a record medium such as an optical disc or the like.

On the both sides portions in a longitudinal direction of the slide board, holding members are equipped. Each of the holding members is applied with an elastic force toward concave portions formed on the both side portions of the slide board so that the holding members are engaged with those concave portions.

In the lower part of the substantial center of the slide board, a slot portion is formed, while a stopper is equipped on the back side surface of the operation panel at a position opposing to the slot portion. Accordingly, the stopper is inserted in or engaged with the slot portion.

When the operation panel attached to and held by the slide board is to be detached, a user firstly moves the slide board from the close condition to the open condition by operating an operation button for removing. Next, the user operates the stopper to releases the engagement between the stopper and the slot portion.

Moreover, the user pulls out the operation panel so as to release the engagement between the holding members and the concave portions, to thereby completely detach the operation panel from the slide board.

However, according to the above mentioned on-vehicle AV apparatus, the operation panel cannot be easily detached from the slide board, because the user has to keep pressing the operation button for removing while pulling out the operation panel.

Moreover, when the user pulls out the operation panel while pressing the operation button for removing, the orientation of the operation panel tends to be diagonal or inclined in the middle of the sliding movement, because the user has to slide the holding members for a significant distance of the operation panel. As a result, it is certainly difficult to detach the operation panel.

SUMMARY OF THE INVENTION

It is therefore an object of the present invention to provide an electronic equipment, which enables a user to easily detach an operation panel from an apparatus main body thereof.

The above object of the present invention can be achieved by an electronic equipment provided with: a holding portion having a longitudinal plate shape, which is disposed on a front surface of an apparatus main body of the electronic equipment and is movable between a first position to cover the front surface and a second position to expose the front surface to an open air; an operation panel having a longitudinal shape; and a holding mechanism for holding the operation panel detachably with respect to the holding portion, the holding mechanism having a locking device disposed on the holding portion and an engaging device disposed on a back surface of the operation panel, the locking device including a pair of lock portions disposed on the holding portion at both sides portions in a longitudinal direction of the holding portion, each of the lock portions comprising a plurality of lock members arranged along a plane surface of the holding portion and perpendicular to the longitudinal direction of the holding portion; the engaging device including a pair of engagement portions disposed on the operational panel at both side portions in a longitudinal direction of the operation panel, each of the engagement portions comprising a groove wall portion defining a plurality of engagement grooves arranged along the back surface of the operation panel and perpendicular to the longitudinal direction of the operational panel, the holding portion detachably holding the operational panel by engaging each of the lock members with respective one of the engagement grooves.

According to the electronic equipment of the present invention, the holding mechanism has the locking device disposed on the holding portion and the engaging device disposed on the back surface of the operation panel. The locking device includes a pair of lock portions each comprising a plurality of lock members arranged along the plane surface of the holding portion and perpendicular to the longitudinal direction of the holding portion. Namely, the locking device includes the divided and arranged lock members. Further, the engaging device includes a pair of engagement portions each comprising the groove wall portion defining a plurality of engagement grooves arranged along the back surface of the operation panel and perpendicular to the longitudinal direction of the operational panel. Namely, the engaging device includes the divided and arranged engagement grooves which engage with the lock members respectively. Accordingly, it is possible to decrease the moving amount to pull out the operation panel necessary for the release of the engagement between the lock members and the engagement grooves, so that it is possible to easily release this engagement between the lock members and the engagement grooves.

In one aspect of the present invention, each of the lock members is supported by an elastic member such that each of the lock members is applied with an elastic force by the elastic member in the longitudinal direction of the holding portion and toward an inside of the holding portion.

According to this aspect, because a plurality of lock members are respectively applied with the elastic force by the elastic member toward the inside of the holding portion, the engagement between the lock members and the engagement grooves can be easily released, and the engagement condition can be made stable when the operation panel is attached.

In another aspect of the present invention, the groove wall portion comprises a stopper wall for maintaining an engagement condition with the engagement grooves by stopping respective one of the lock members, when the holding portion to which the operation panel is attached moves from the first position to the second position.

According to this aspect, because each groove wall portion has a stopper wall to stop the lock member when the holding portion is moved, it is easy to detach the operation panel and it is also possible to prevent the release of the engagement between the lock members and the engagement grooves by the force or inertia caused by the movement of the holding portion.

In the above mentioned aspect of the present invention in which the elastic member is employed, the elastic member may be wound at a substantially central portion thereof around a fixed pin disposed on the holding portion and may apply an elastic force to each of the lock members with the substantially central portion as a fulcrum.

By constituting in this manner, because each lock member is applied with the elastic force with the substantially central part of respective one of the elastic members, it is possible to stably apply the elastic force to the lock member toward the inside of the holding portion In the above mentioned aspect of the present invention in which the stopper wall is employed, at least one of the engagement grooves may be defined by an inclined wall with a certain inclination, and the at least one of the engagement grooves and another engagement groove adjacent thereto may be arranged such that the inclined wall and the stopper wall of the another engagement groove are proximate to each other and that the inclined wall is inclined toward a direction apart from the stopper wall from an inside of the back surface of the operation panel.

By constituting in this manner, because at least one of the engagement grooves may be defined by the inclined wall, which is inclined toward the direction apart from the stopper wall, it is possible to prevent the lock member, whose engagement condition with another engagement groove is released, from entering, and thus it is possible to detach the operation panel easily and certainly.

In another aspect of the present invention, the electronic equipment comprises an on-vehicle A/V (Audio/Visual) equipment.

According to this aspect, the on-vehicle A/V equipment, in which the operation panel can be easily detached with respect to the apparatus main body at the front panel in the vehicle, can be realized.

In another aspect of the present invention, a slot through which a record medium can be inserted and removed is formed in the front surface of the apparatus main body.

According to this aspect, when the holding portion is moved to the second position, the slot is exposed so that the record medium such as an optical disc or the like can be inserted and removed therethrough.

In another aspect of the present invention, the holding portion is movably fixed to the apparatus main body a pair of supporting members at both side portions in the longitudinal direction of the holding portion, each of the supporting members being slidable with respect to the apparatus main body in a direction perpendicular to the front surface thereof.

According to this aspect, it is possible to stably and accurately move the holding portion by the supporting members in the direction perpendicular to the front surface of the apparatus main body, to thereby enable the easy release of the operational panel.

DETAILED DESCRIPTION OF THE PREFERRED EMBODIMENT

Referring to the accompanying drawings, the embodiment of the present invention will be now explained.

Figure 1A:
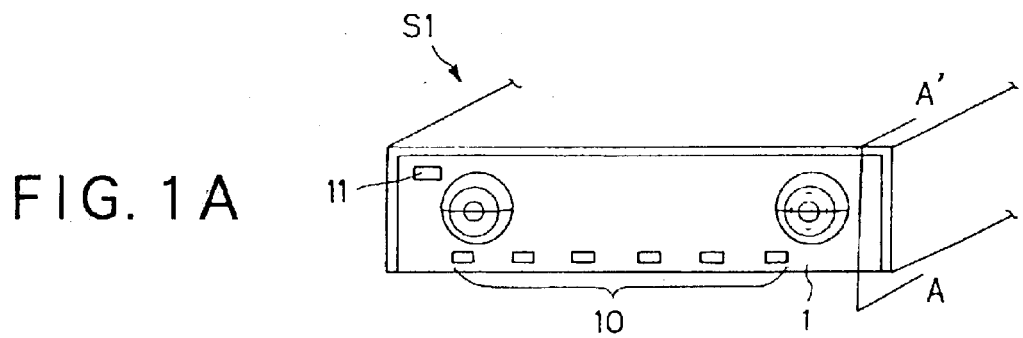
FIG. 1A is a partial perspective view showing an on-vehicle AV apparatus of a preferred embodiment of the invention in one condition.
Figure 1B:
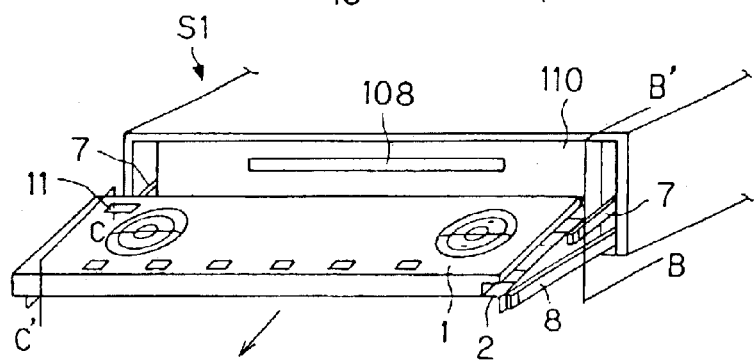
FIG. 1B is a partial perspective view showing the on-vehicle AV apparatus of the embodiment in another condition.
Figure 1C:
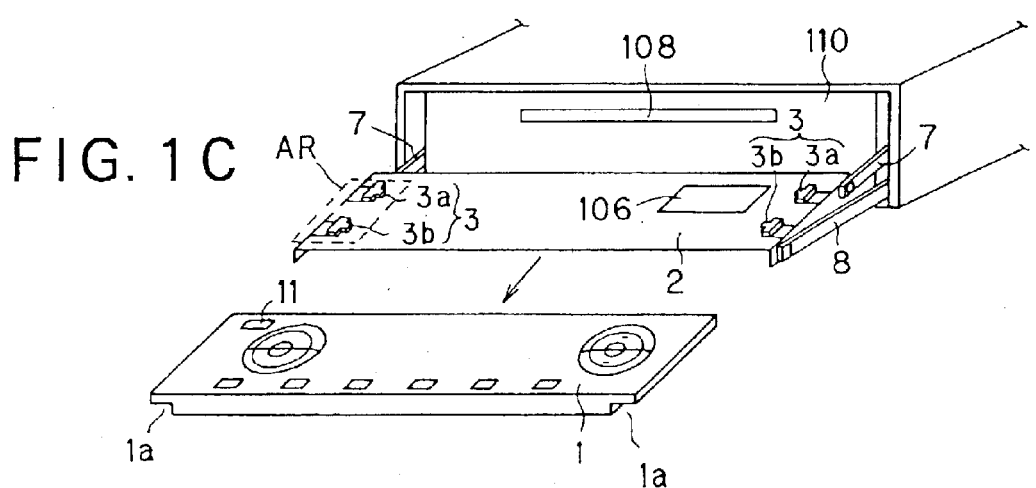
FIG. 1C is a partial perspective view showing the on-vehicle AV apparatus of the embodiment in another condition.

FIG. 1A to FIG. 1C show an on-vehicle AV apparatus S1 of the preferred embodiment of the invention in various conditions. Namely, FIG. 1A shows such a condition that an operation panel 1 is attached to an apparatus main body of the on-vehicle AV apparatus S1 and is in a position to cover the front surface of the apparatus 110 (hereinbelow, this position is called as a "first position"). FIG. 1B shows such a condition that the operation panel 1 is still attached to the apparatus main body and is in a position to expose the front surface 110 of the apparatus main body to the open air (hereinbelow, this position is called as a "second position").

FIG. 1C shows such a condition that the operation panel 1 is completely detached from the apparatus main body.

As shown in FIG. 1B and FIG. 1C, when the operation panel 1 is in such a position that the front surface of the apparatus main body is exposed to the open air, a record medium insertion slot 108 disposed on the front surface of the apparatus main body is also exposed, which makes it possible to insert or remove therethrough a record medium such as an optical disc or the like.

An operation panel 1 shaped in a longitudinal plate has, on the front side thereof, a plurality of kinds of operation buttons 10 in order to give various kinds of operation instructions to the on-vehicle AV apparatus S1.

Moreover, on the both sides of the back side surface of the operation panel 1, there are formed concave portions 1a, each substantially shaped in a L-letter and having a pair of engage portions to engage with lock portions 3.

On the other hand, on the front side surface of the apparatus main body, there is equipped a slide board 2, which is shaped in a longitudinal plate, in order to attach and hold the operation panel 1. The slide board 2 is adapted to be moved from the first poison to the second position by a drive mechanism described later, as a user operates an operation button 11 disposed on the upper part of the left side of the front surface of the operation panel 1. Moreover, as shown in FIG. 1C, on both sides of the slide board 2, there are formed the lock portions 3 in order to attach and hold the operation panel 1. Incidentally, the details of the engagement portions and the lock portions 3 will be described later.

The slide board 2 has a connecting terminal 106 to electronically connect wires or lines, through which electronic signals occurred by the operations of the operation buttons 10 and the operation button 11 of the operation panel 1 are transmitted. When a user operates one or a plurality of the operation buttons 10 or the operation button 11 in a condition that the slide board 2 attaches and holds the operation panel 1, the electronic signal depending on the operation is transmitted to the apparatus main body through the connecting terminal 106, so that various operation conditions are established in the on-vehicle AV apparatus S1.

Figure 2A:
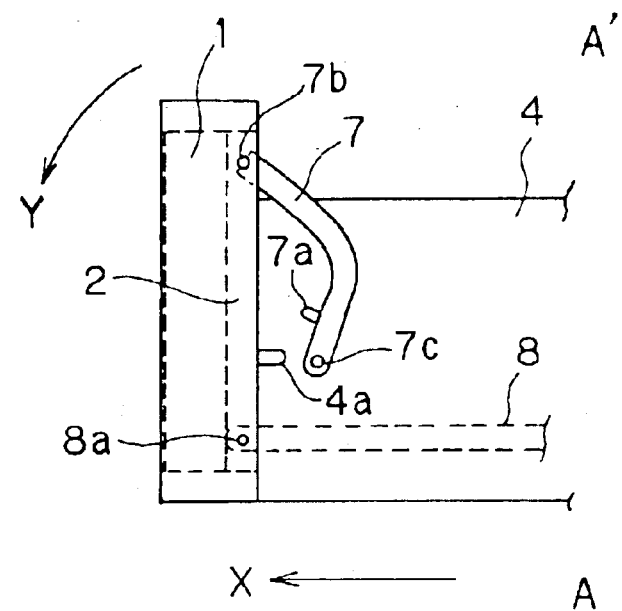
FIG. 2A is an A-A' sectional view of FIG. 1A showing a drive mechanism for moving a slide board in the embodiment in one condition.
Figure 2B:
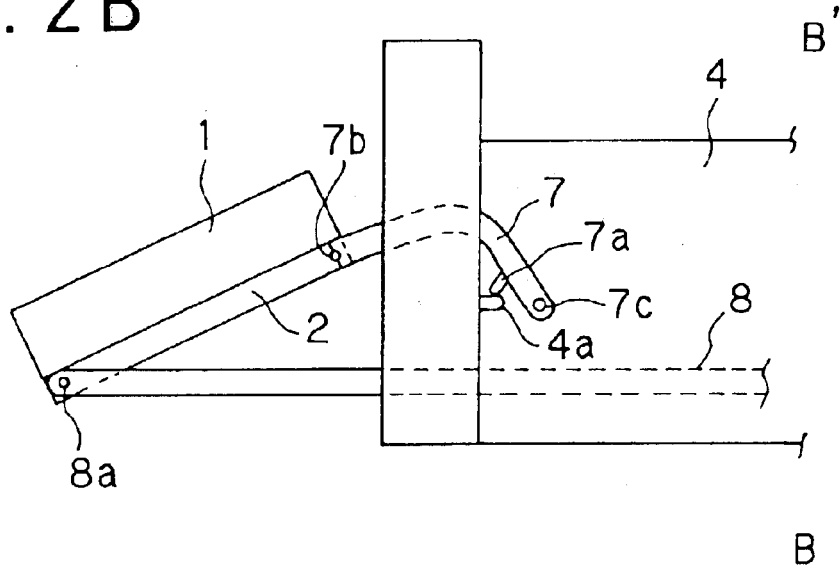
FIG. 2B is a B-B' sectional view of FIG. 1B showing the drive mechanism in the embodiment in another condition.

FIG. 2A and FIG. 2B show the drive mechanism, in which the slide board 2 can be moved freely through the first position to the second position. FIG. 2A is an A-A' sectional view of FIG. 1A. FIG. 2B is a B-B' sectional view of FIG. 1B.

One end 7b of a roughly L-shaped connecting member 7 is supported by the top of the side portion of the slide board 2, so as to be freely swung or rotated therearound Another end 7c of the connecting member 7 is supported by the side surface of a fixed chassis 4, so as to be freely swung or rotated therearound. One end 8a of a supporting member 8 is supported by the bottom end of the side portion of the slide board 2, so as to be freely reciprocated in the inner and outer directions of the apparatus main body by a driving force from a not-illustrated drive source which is disposed within the apparatus main body.

Moreover, the connecting member 7 has the projection 7a, and the fixed chassis 4 has a stopper 4a at such a position that the stopper 4a abuts onto the projection 7a when the one end 7b of the connecting member 7 is rotated by a certain angle in the Y-direction shown in FIG. 2A.

Although a structure of the drive mechanism on the right side of the front surface of the slide board 2 has been explained here, the drive mechanism on the left side of the front surface of the slide board 2 has the substantially same or symmetrical structure.

The slide board 2 is operated by the above mentioned drive mechanism as follows.

Under a condition that the slide board 2 attaching and holding the operation panel 1 is in the first position, if the user presses down the operation button 11, the supporting members 8 is moved in the outer direction, i.e., in the X-direction shown in FIG. 2A from the inside of the apparatus main body in response to the driving force from the driving source equipped in the apparatus main body. Then, the top of the slide board 2 is moved with the one end 8a as the fulcrum in the direction parallel to the front surface of the apparatus main body.

The one end 7b of the connecting member 7 is rotated with the another end 7c as the fulcrum in the Y-direction shown in FIG. 2A accompanied with the movement of the slide board 2. When the connecting member 7 is rotated by a certain angle, the projection 7a abuts onto the stopper 4a, to thereby stop the rotation of the slide board 2. As a result, the slide board 2 attaching and holding the operation panel 1 is moved to the second position.

Next, a holding mechanism in which the slide board 2 attaches and holds the operation panel 1 is explained with reference to FIG. 3A to FIG. 5C.

Figure 3A:
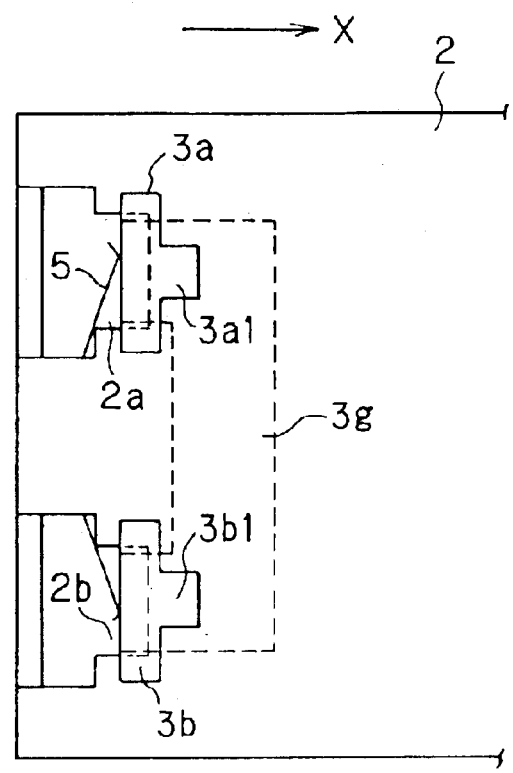
FIG. 3A is a magnified partial plan view of a lock device at a front side thereof in the embodiment.
Figure 3B:
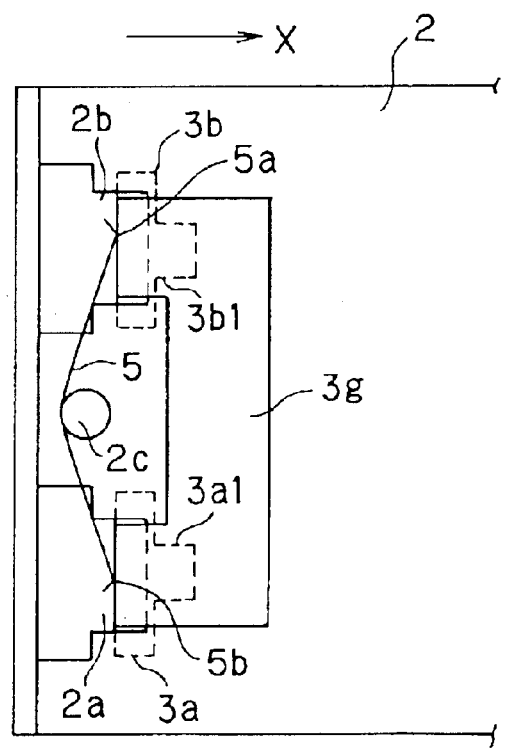
FIG. 3B is a magnified partial plan view of the locking device at a back side thereof in the embodiment.

FIG. 3A and FIG. 3B show the lock portion 3. FIG. 3A is a magnified partial plan view of an area AR surrounded by a dotted line shown in FIG. 1C. FIG. 3B shows the back side of the FIG. 3A.

Figure 4A:
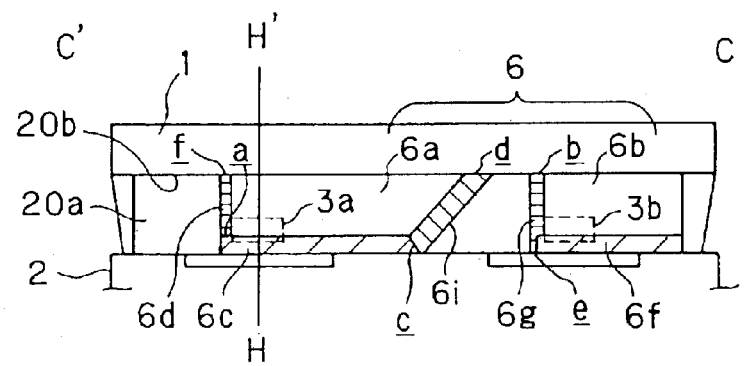
FIG. 4A is a C-C' sectional view of FIG. 1B, showing an engagement portion and the lock portion engaged with each other in the embodiment.
Figure 4B:
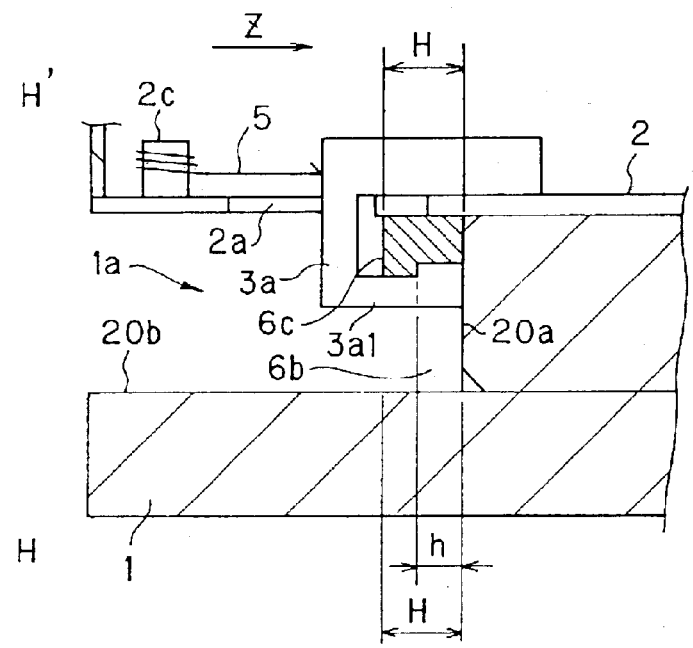
FIG. 4B is an H-H' sectional view of FIG. 4A.

FIG. 4A and FIG. 4B show an engagement portion 6 and the lock portion 3 engaged to the engagement portion 6. FIG. 4A is a C-C' sectional view of FIG. 1B. FIG. 4B is an H-H' sectional view of FIG. 4A.

Figure 5A:
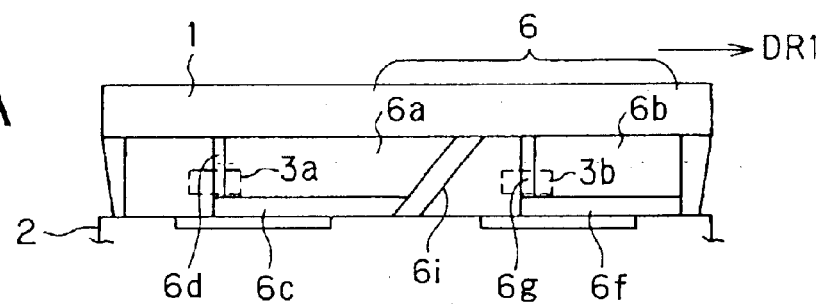
FIG. 5A is one schematic partial side view of the engagement portion and the lock portion showing a releasing operation in the embodiment.
Figure 5B:
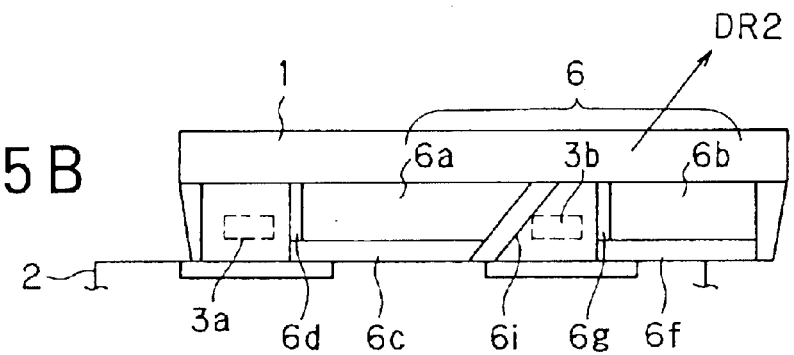
FIG. 5B is another schematic partial side view of the engagement portion and the lock portion showing the releasing operation in the embodiment.
Figure 5C:
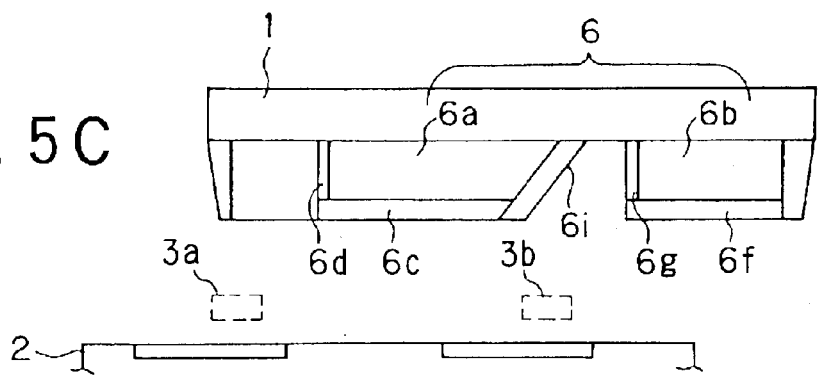
FIG. 5C is another schematic partial side view of the engagement portion and the lock portion showing the releasing operation in the embodiment.

FIG. 5A to FIG. 5C show a process of releasing the engagement between the lock portion 3 and an engagement portion 6 by a user's manual operation. FIG. 5A shows the middle of releasing of the engagement. FIG. 5B shows the state right after the engagement is released. FIG. 5C shows that the engagement between the lock portion 3 and the engagement portion 6 is completely released.

First, the lock portion 3 as one example of a locking device will be explained.

Incidentally, the lock portion 3 disposed on the left side portion of the front surface of the slide board 2 will be explained as a representative, since the lock portion 3 disposed on the both sides portions of the slide board 2 have the substantially same or symmetrical structure to each other.

As shown in FIG. 3A and FIG. 3B, the lock portion 3 includes a plurality of lock members 3a and 3b integrally connected to each other by a connecting portion 3g, and a spring 5 applying an elastic force to the lock members 3a and 3b in the X-direction shown in FIG. 3A and FIG. 3B.

The lock members 3a and 3b are arranged in parallel to the plain surface of the slide board 2 and perpendicular to the longitudinal direction of the slide board 2, and are set in notches 2a and 2b disposed on the both sides portions of the slide board 2. The central part of the spring 5 winds around a fixed pin 2c, which is protruded from the back side surface of the slide board 2. The both ends portions 5a and 5b of the spring 5 are attached to the lower parts of the lock members 3a and 3b respectively, which are located on the back side of the slide board 2. In other words, the spring 5 applies the elastic force to the respective lock members 3a and 3b, with the central portion thereof wound around the fixed pin 2c as the fulcrum, in the X-direction shown in FIG. 3A, i.e., in the longitudinal direction of the slide board 2 and toward the inside thereof.

Convex lock projecting parts 3a1 and 3b1 are formed on the upper parts of the lock members 3a and 3b respectively, at the front surface side of the slide board 2. The projected ends of the lock projecting parts 3a1 and 3b1 are directed toward the center of the slide board 2 and are disposed in parallel to each other.

Next, the engaging device will be explained.

The engagement portion 6 formed in the concave portion 1a on the left side on the surface of the operation panel 1 is explained here as a representative, since the engaging device comprises a pair of the engagement portions 6 which are formed in the concave portions 1a on the both sides of the operation panel 1 and which have the substantially same or symmetrical structure to each other.

As shown in FIG. 4A, the engagement portion 6 has a plurality of engagement grooves 6a and 6b.

The engagement groove 6a is defined by an engagement wall 6c, a stopper wall 6d and an inclined wall 6i. The engagement wall 6c stands up from a bottom part 20a of the concave portion 1a formed on the back surface side of the operational panel 1 toward the direction parallel to a side surface portion 20b of the concave portion 1a, and has a height H to engage with the lock member 3a. The stopper wall 6d stands up from the bottom part 20a in the direction perpendicular to the side surface portion 20b so as to engage with one side portion of the engagement wall 6c at one side portion thereof (in FIG. 4A, which is indicated as a portion a), and has a height h lower than the height H of the engagement wall 6c.

The inclined wall 6i stands up from the bottom part 20a so as to engage with the other side portion of the engagement wall 6c at one side portion thereof (in FIG. 4A, which is indicated as a portion c), and has the height H same as the engagement wall 6c. The other side portion of the inclined wall 6i and the other side portion of the stopper wall 6d are attached to the side surface portion 20b of the concave portion 1a (in FIG. 4A, which is indicated by a portion f).

The engagement groove 6b is defined by an engagement wall 6f, and a stopper wall 6g. The engagement wall 6f stands up from the bottom part 20a toward the direction parallel to the side surface portion 20b and has the height H to engage with the lock member 3b. The stopper wall 6g stands up from the bottom part 20a in the direction perpendicular to the side surface portion 20b so as to engage with one side portion of the engagement wall 6f at one side portion thereof (in FIG. 4A, which is indicated as a portion e), and has the height h lower than the height H of the engagement wall 6f. The other side portion of the stopper wall 6g is attached to the side surface portion 20b of the concave portion 1a (in FIG. 4A, which is indicated by a portion b).

Here, the engagement grooves 6a and 6b are perpendicular to the longitudinal direction of the operation panel 1 along the back side thereof, and are arranged such that the inclined wall 6i of the engagement groove 6a and the stopper wall 6g of the engagement groove 6b are close to each other. Moreover, the attached portion d does not face to the attached portion c, but is placed closer to the stopper wall 6g than to the attached portion c. In other words, by shifting or offsetting the positions of these attached portions, the inclined wall 6i stands up from the bottom surface part 20a and is inclined toward the direction apart from the stopper wall 6g.

The locking device and the engaging device having the above mentioned structure attach and hold the operation panel 1 to the slide board 2 i.e., the apparatus main body as a plurality of lock members 3a and 3b and a plurality of engagement grooves 6a and 6b are engaged to each other. More concretely, as shown in FIG. 4B, as the lock projection 3a1 of the lock member 3a and the engagement wall 6c of the engagement groove 6a are engaged with each other and the spring 5 applies the elastic force to the lock portion 3a in the Z direction shown in FIG. 4B, the locking device and the engaging device attach and hold it. Incidentally, the lock member 3b and the engagement groove 6b functions in the same manner.

Moreover, when the lock member 3 engages with the engagement groove 6b, one side portion at the tip of the lock projection 3a1 abuts onto the stopper wall 6d. In other words, the lock members 3a and 3b and the engagement grooves 6a and 6b are placed so that one side portion at the tip of each of the lock projections 3a1 and 3b1 are respectively abut onto and engaged with the stopper walls 6d and 6g.

The stopper walls 6d and 6g prevent the release of the engagement between the lock projections 3a1 and 3b1 and the engagement walls 6c and 6f, caused by the force applied in the sliding direction of the slide board 2 slides i.e., in the direction of the arrow shown in FIG. 1B, when the slide board 2 is moved from the first position to the second position while attaching and holding the operation panel 1.

In other words, the height h of the stopper walls 6d and 6g is such a height as to bear the load worked in the sliding direction of the slide board 2 by the movement of the slide board 2, so that it prevents the operation panel 1 from being released from the slide board 2 contrary to a user's intention, as the stopper walls 6d and 6g hook and stop one side portions of the lock projections 3a1 and 3b1 respectively.

Next, the case that a user releases the engagement between the locking device and the engaging device having the above mentioned structure to thereby remove the operation panel 1 attached to and held by the slide board 2 will be explained.

First, a user moves the slide board 2 from the first position shown in FIG. 1A to the second position shown in FIG. 1B by operating the operation button 11 on the operation panel 1. Next, when the user pulls out the operation panel 1 attached to and held by the slide board 2 in the direction of an arrow DR1 shown in FIG. 5A, the lock projections 3a1 and 3b1 respectively are pressed against the stopper walls 6d and 6g.

Moreover, if the user keeps pulling, the stopper walls 6d and 6g receive a stronger force than a force occurred by the movement of the slide board 2 This stronger force widens the spring 5 against the elastic force thereof, and releases the engagement between the lock projections 3a1 and 3b1 and the engagement walls 6c and 6f. Then, the lock projections 3a1 and 3b1 are about to go over the stopper walls 6d and 6g with the height h, as shown in FIG. 5A.

Incidentally, because the height h of the stopper walls 6d and 6g is shorter than the height H of the engagement walls 6c and 6f, the lock projections 3a1 and 3b1 can accurately go over the respective stopper walls 6d and 6g without shifting the locus of the lock projections 3a1 and 3b1.

After the lock projections 3a1 and 3b1 go over the respective stopper walls 6d and 6g, the lock projection 3b1 is about to the rough center part of a inclined wall 6i, as shown in FIG. 5B. If the user further keeps pulling the operation panel 1, the lock projection 3b1 moves along the slope of the inclined wall 6i, and the operation panel 1 can be removed in the direction of an arrow DR2 shown in FIG. 5B.

Then, as shown in FIG. 5C, the engagement between the lock members 3a and 3b and the engagement grooves 6a and 6b are completely released, and the operation panel 1 is completely detached from the slide board 2.

Incidentally, the inclined wall 6i with height H is higher than the stopper wall 6g with the height h, so that the lock projection 3b1 cannot go over the inclined wall 6i by the inertia generated when it passes the stopper wall 6g. In other words, it is possible to prevent the lock projection 3a1 from entering into the engagement groove 6a and from engaging the engagement wall 6c. It is also possible to move the lock projection 3a1 accurately along the slope.

Therefore, when the user detaches the operation panel 1 from the slide board 2, he may just move the lock projections 3a1 and 3b1 as far as they can go over the respective stopper walls 6d and 6g. Accordingly, because the length of pulling the operation panel is short, the user can easily detach the operation panel 1 from the slide board 2, i.e., the apparatus main body.

Incidentally, it has been explained the release of the engagement between the lock portion placed on the left side of the front surface of the slide board 2 and the engagement portion formed in the concave portion 1a on the left side seeing from the front of the operation panel 1. The engagement between the lock procedure placed on the right side of the front surface of the slide board 2 and the engagement procedure formed in the concave portion 1a on the right side seeing from the front of the operation panel 1 is released in the same manner as the above mentioned.

Next, a comparison example of an on-vehicle AV apparatus, which has a mechanism for detachably holding an operation panel, will be explained with reference to FIG. 6A to FIG. 6C, and FIG. 7A and 7B. In those figures, the same constitutional elements as those in the above described embodiment shown in FIG. 1A to FIG. 5C carry the same reference numerals and the detailed explanations of them are omitted.

In the comparison example, an operation panel is detachable with respect to an apparatus main body, there is an on-vehicle AV apparatus, in which an operation panel is detachable with respect to a holding or retaining member freely movable between a position to cover a front surface of the apparatus main body and a position to expose or open the front surface of the apparatus main body to the open air.

Figure 6A:
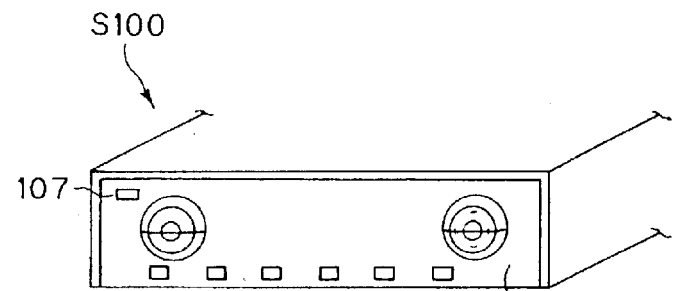
FIG. 6A is a partial perspective view showing an on-vehicle AV apparatus of a comparison example of the invention in one condition.
Figure 6B:
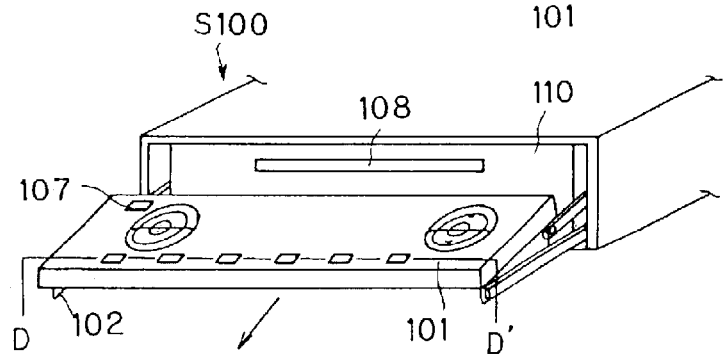
FIG. 6B is a partial perspective view showing the on-vehicle AV apparatus of the comparison example in another condition.
Figure 6C:
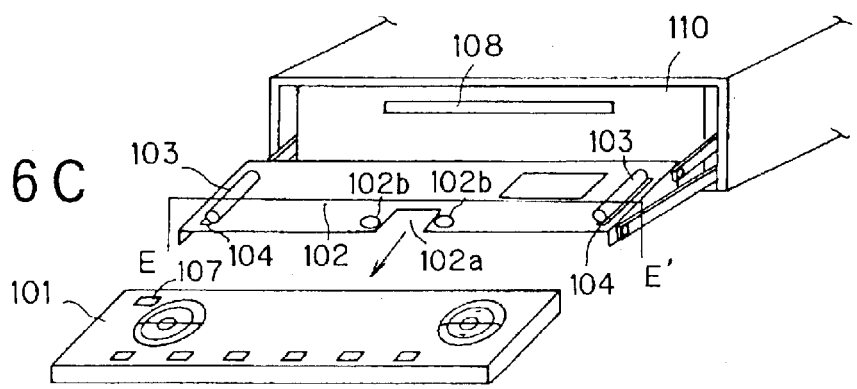
FIG. 6C is a partial perspective view showing the on-vehicle AV apparatus of the comparison example in another condition.

FIG. 6A to FIG. 6C show an on-vehicle AV apparatus S100 in various conditions. Namely, FIG. 6A shows such a condition that an operation panel 101 is attached to the apparatus main body and is in a position to cover the front surface of the apparatus main body. FIG. 6B shows such a condition that the operation panel 101 is still attached to the apparatus main body and is in a position to expose the front surface 110 of the apparatus main body to the open air. FIG. 6C shows such a condition that the operation panel 101 is detached from the apparatus main body.

Figure 7A:
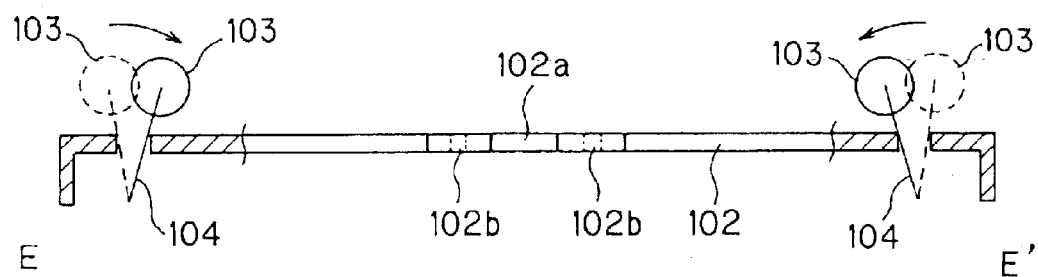
FIG. 7A is an E-E' sectional view of FIG. 6C showing a drive mechanism for moving a slide board in one condition in the comparison example.
Figure 7B:
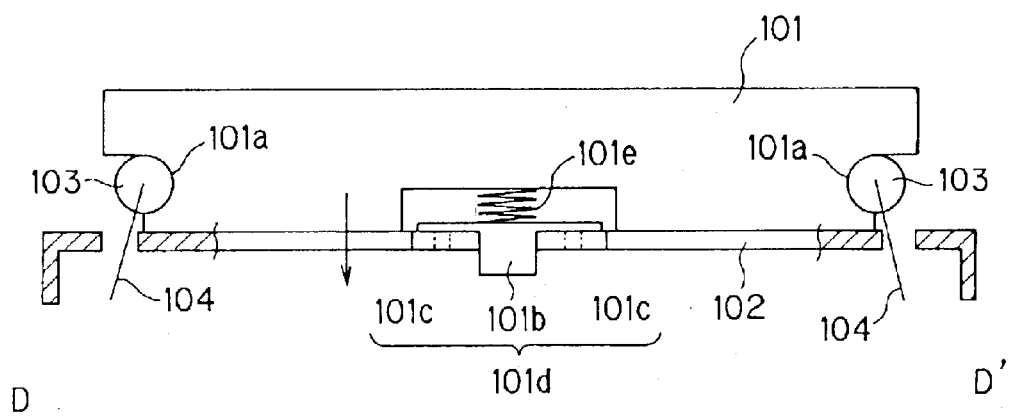
FIG. 7B is a D-D' sectional view of FIG. 6B showing the drive mechanism in another condition in the comparison example.

FIG. 7A and FIG. 7B show a holding mechanism in which the operation panel 101 is attached to and held by a slide board 102. FIG. 7A is an E-E' cross sectional view of FIG. 6C, and FIG. 7B is a D-D' cross sectional view of FIG. 6B.

The on-vehicle AV apparatus S100 has the slide board 102, which is shaped in a longitudinal flat plate and which holds the operation panel 101, at the front surface side of the apparatus main body.

The slide board 102 is moved from the condition shown in FIG. 6A to the condition shown in FIG. 6B by a drive mechanism, which is not illustrated, by operating an operation button 107, which is disposed on an upper part of the left side of the front surface of the operation panel 101. Moreover, as shown in FIG. 6B, when the operation panel 101 is in such a position that the front surface of the apparatus main body is exposed to the open air, a record medium insertion slot 108 disposed on the front surface of the apparatus main body is exposed to the open air, which makes it possible to insert or remove therethrough a record medium such as an optical disc or the like.

On the both sides portions in a longitudinal direction of the slide board 102, holding members 103 each shaped in a cylinder for attaching and holding the operation panel. 101 are equipped. Each of the holding members 103 is applied with an elastic force in the direction of respective one of arc arrows shown in FIG. 7A by respective one of the springs 104 The cylindrical axes of the holding members 103 are positioned parallel to the flat surface of the slide board 102 and perpendicular to the longitudinal direction of the slide board 102. In the lower part of the substantial center of the slide board 102, a slot portion 102a is formed. On the both sides of the slot portion 102a, a pair of apertures 102b are formed.

Moreover, as shown in FIG. 7B, on the back side surface of the operation panel 101, a stopper 101d is disposed at a position opposing to each of the slot portion 102a and the apertures 102b. More concretely, the stopper 101d is constructed such that a button portion 101b and a pair of projections 101c thereof are integrally formed.

Incidentally, the button portion 101b is inserted into the slot portion 102a, and a pair of the projections 101c are inserted into a pair of the apertures 102b respectively. Furthermore, the stopper 101d is connected to the operation panel 101 through a spring 101e and is applied with an elastic force in the direction of an arrow shown in FIG. 7B by the spring 101e Moreover, at the both sides portions of the operation panel 101, there are formed concave portions 101a to engage with the holding members 103 respectively.

In the on-vehicle AV apparatus S100 having such a structure, the holding members 103 of the slide board 102 are engaged with the concave portions 101a of the operation panel 101 respectively, and the button portion 101b and a pair of the projections 101c of the operation panel 101 are respectively inserted into the slot portion 102a and a pair of the apertures 102b formed on the slide hoard 102, so that the slide board 102 attaches and holds the operation panel 101.

When the operation panel 110 attached to and held by the slide board 102 is to be detached, a user firstly moves the slide board 102 from the position shown in FIG. 6A to the position shown in FIG. 6B by operating the operation button 107. Next, the user presses the button portion 101b of the stopper 101d against the elastic force of the spring 101e, and releases the engagement between a pair of the projections 101c and a pair of the apertures 102b. Moreover, the user pulls out the operation panel 101 in the direction of the arrow shown in FIG. 6B, while pressing the button 101b, so that the holding members 103 are slid by their full length along the concave portions 101a, which releases the engagement between the holding members 103 and the concave portions 101a. As a result, as shown in FIG. 6C, the operation panel 101 is completely detached from the slide board 102.

In addition, the slide board 102 is moved to a position to cover the front surface of the apparatus main body when a not-illustrated detecting device detects that the operation panel 101 is completely detached from the slide board 102.

In this manner, the on-vehicle AV apparatus S100 as the comparison example is not constructed such that the operation panel 101 can be easily detached, because the user has to keep pressing the button portion 101b while pulling out the operation panel 101 when the user attempts to detach the operation panel 101, which is attached to and held by the slide board 102.

Moreover, when the user pulls out the operation panel 101 while pressing the button portion 101b, the orientation of the operation panel 101 tends to be diagonal or inclined in the middle of the sliding movement, because the user has to slide the holding members 103 by the full length thereof along the concave portions 101a of the operation panel 101. As a result, it is certainly difficult to detach the operation panel 101

On the contrary to this comparison example, according to the present embodiment as described above in detail, the user can easily detach the operation panel 1 from the apparatus main body of the on-vehicle electronic apparatus S1.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2000-335308 filed on Nov. 2, 2000 including the specification, claims. drawings and summary is incorporated herein by reference in its entirety.

What is claimed:

1. An electronic equipment comprising:
   a holding portion having a longitudinal plate shape, which is disposed on a front surface of an apparatus main body of said electronic equipment;
   an operation panel having a longitudinal shape; and
   a holding mechanism for holding said operation panel detachably with respect to said holding portion,
   said holding mechanism comprising a locking device disposed on said holding portion and an engaging device disposed on said operation panel,
   said locking device comprising a pair of lock portions disposed on said holding portion at both sides portions in a longitudinal direction of said holding portion, each of said lock portions comprising a plurality of lock members arranged perpendicular to the longitudinal direction of said holding portion,
   said engaging device comprising a pair of engagement portions disposed on said operational panel at both side portions in a longitudinal direction of said operation panel, each of said engagement portions comprising a groove wall portion defining a plurality of engagement grooves arranged perpendicular to the longitudinal direction of said operational panel,
   said holding portion detachably holding said operational panel by engaging each of said lock members with respective one of said engagement grooves.

2. An electronic equipment according to claim 1, wherein said holding portion is movable between a first position to cover the front surface of said apparatus main body and a second position to expose the front surface of said apparatus main body to an open air.

3. An electronic equipment according to claim 1, wherein each of said lock members is supported by an elastic member such that each of said lock members is applied with an elastic force by said elastic member in the longitudinal direction of said holding portion and toward an inside of said holding portion.

4. An electronic equipment according to claim 3, wherein said elastic member is wound at a substantially central portion thereof around a fixed pin disposed on said holding portion and applies an elastic force to each of said lock members with the substantially central portion as a fulcrum.

5. An electronic equipment according to claim 1, wherein said groove wall portion comprises a stopper wall for maintaining an engagement condition with said engagement grooves by stopping respective one of said lock members, when said holding portion to which said operation panel is attached moves from the first position to the second position.

6. An electronic equipment according to claim 5, wherein at least one of said engagement grooves is defined by an inclined wall with a certain inclination, and said at least one of said engagement grooves and another engagement groove adjacent thereto are arranged such that said inclined wall and said stopper wall of said another engagement groove are proximate to each other and that said inclined wall is inclined toward a direction apart from said stopper wall from an inside of the back surface of said operation panel.

7. An electronic equipment according to claim 1, wherein said electronic equipment comprises an on-vehicle A/V (Audio/Visual) equipment.

8. An electronic equipment according to claim 1, wherein a slot through which a record medium can be inserted and removed is formed in the front surface of said apparatus main body.

9. An electronic equipment according to claim 1, wherein said holding portion is movably fixed to said apparatus main body a pair of supporting members at both side portions in the longitudinal direction of said holding portion, each of said supporting members being slidable with respect to said apparatus main body in a direction perpendicular to the front surface thereof.

10. An electronic equipment according to claim 1, wherein,
   each of said pair of lock portions comprising at least two spaced apart lock members arranged perpendicular to the longitudinal direction of said holding portion, each of the lock members being a lock projection, and
   each of said pair of engagement portions comprise at least two spaced apart engagement grooves, each engagement groove comprising plural wall segments extending from the groove wall to engage a corresponding lock projection.

11. An electronic equipment comprising:
   an apparatus main body;
   a holding portion, having a longitudinal plate shape, disposed on a front surface of the apparatus main body;
   an operation panel having a longitudinal shape; and
   a holding mechanism holding said operation panel detachably with respect to said holding portion,
   said holding mechanism comprising a locking device disposed on said holding portion and an engaging device disposed on said operation panel,
   said locking device comprising a pair of lock portions disposed on said holding portion at both sides portions in a longitudinal direction of said holding portion,
   each of said lock portions comprising a plurality of lock members arranged perpendicular to the longitudinal direction of said holding portion,
   said engaging device comprising a pair of engagement portions disposed on said operational panel at both side portions in a longitudinal direction of said operation panel, each of said engagement portions comprising a groove wall portion defining a plurality of engagement grooves arranged perpendicular to the longitudinal direction of said operational panel, said holding portion detachably holding said operational panel by engaging each of said lock members with respective one of said engagement grooves, wherein said holding portion is movably fixed to said apparatus main body by a pair of supporting members at both side portions in the longitudinal direction of said holding portion, each of said supporting members being slidable with respect to said apparatus main body in a direction perpendicular to the front surface thereof.

12. An electronic equipment according to claim 11, wherein said holding portion is movable between a first position to cover the front surface of said apparatus main body and a second position to expose the front surface of said apparatus main body to an open air.

13. An electronic equipment according to claim 11, wherein said groove wall portion comprises a stopper wall for maintaining an engagement condition with said engagement grooves by stopping respective one of said lock members, when said holding portion to which said operation panel is attached moves from the first position to the second position.

14. An electronic equipment according to claim 11, wherein at least one of said engagement grooves is defined by an inclined wall with a certain inclination, and said at least one of said engagement grooves and another engagement groove adjacent thereto are arranged such that said inclined wall and said stopper wall of said another engagement groove are proximate to each other and that said inclined wall is inclined toward a direction apart from said stopper wall from an inside of the back surface of said operation panel.

15. An electronic equipment comprising:

an electronic equipment apparatus main body with a front surface;

a holding portion, having a longitudinal plate shape, disposed on the front surface;

an operation panel having a longitudinal shape; and a holding mechanism holding said operation panel detachably to said holding portion, said holding mechanism comprising a locking device disposed on said holding portion and an engaging device disposed on said operation panel, said locking device comprising a pair of lock portions disposed on said holding portion at both sides portions in a longitudinal direction of said holding portion, each of said lock portions comprising a plurality of lock members arranged perpendicular to the longitudinal direction of said holding portion, said engaging device comprising a pair of engagement portions disposed on said operational panel at both side portions in a longitudinal direction of said operation panel, each of said engagement portions comprising a groove wall portion defining a plurality of engagement grooves arranged perpendicular to the longitudinal direction of said operational panel, said holding portion detachably holding said operational panel by engaging each of said lock members with respective one of said engagement grooves, wherein, each of said lock members is supported by an elastic member such that each of said lock members is applied with an elastic force by said elastic member in the longitudinal direction of said holding portion and toward an inside of said holding portion, and said elastic member is wound at a substantially central portion thereof around a fixed pin disposed on said holding portion and applies an elastic force to each of said lock members with the substantially central portion as a fulcrum.

16. An electronic equipment according to claim 15, wherein said holding portion is movable between a first position to cover the front surface of said apparatus main body and a second position to expose the front surface of said apparatus main body to an open air.

17. An electronic equipment according to claim 15, wherein said groove wall portion comprises a stopper wall for maintaining an engagement condition with said engagement grooves by stopping respective one of said lock members, when said holding portion to which said operation panel is attached moves from the first position to the second position.

18. An electronic equipment according to claim 15, wherein at least one of said engagement grooves is defined by an inclined wall with a certain inclination, and said at least one of said engagement grooves and another engagement groove adjacent thereto are arranged such that said inclined wall and said stopper wall of said another engagement groove are proximate to each other and that said inclined wall is inclined toward a direction apart from said stopper wall from an inside of the back surface of said operation panel.

19. An electronic equipment according to claim 15, wherein said electronic equipment comprises an on-vehicle A/V (Audio/Visual) equipment.

20. An electronic equipment according to claim 15, wherein a slot through which a record medium can be inserted and removed is formed in the front surface of said apparatus main body.

* * * * *